US008220317B2

(12) United States Patent
Mirkin et al.

(10) Patent No.: US 8,220,317 B2
(45) Date of Patent: Jul. 17, 2012

(54) MASSIVELY PARALLEL LITHOGRAPHY WITH TWO-DIMENSIONAL PEN ARRAYS

(75) Inventors: Chad A. Mirkin, Wilmette, IL (US); Khalid Salaita, Berkeley, CA (US); Yuhuang Wang, Evanston, IL (US); Joseph S. Fragala, San Jose, CA (US); Raymond R. Shile, Los Gatos, CA (US)

(73) Assignees: Northwestern University, Evanston, IL (US); NanoInk, Inc., Skokie, IL (US)

( * ) Notice: Subject to any disclaimer, the term of this patent is extended or adjusted under 35 U.S.C. 154(b) by 1217 days.

(21) Appl. No.: 11/690,738

(22) Filed: Mar. 23, 2007

(65) Prior Publication Data
US 2008/0105042 A1 May 8, 2008

Related U.S. Application Data

(60) Provisional application No. 60/792,950, filed on Apr. 19, 2006.

(51) Int. Cl.
*G01B 5/28* (2006.01)
(52) U.S. Cl. ....................................................... 73/105
(58) Field of Classification Search .................. 73/105
See application file for complete search history.

(56) References Cited

U.S. PATENT DOCUMENTS

| | | | |
|---|---|---|---|
| 5,015,850 A * | 5/1991 | Zdeblick et al. ............... | 850/1 |
| 5,126,574 A | 6/1992 | Gallagher | |
| 5,666,190 A | 9/1997 | Quate et al. | |
| 5,835,477 A | 11/1998 | Binnig et al. | |
| 5,981,733 A | 11/1999 | Gamble et al. | |
| 6,024,925 A | 2/2000 | Little et al. | |
| 6,087,274 A | 7/2000 | Tonucci et al. | |
| 6,635,311 B1 | 10/2003 | Mirkin et al. | |
| 6,642,129 B2 | 11/2003 | Liu et al. | |
| 6,827,979 B2 | 12/2004 | Mirkin et al. | |
| 6,867,443 B2 | 3/2005 | Liu et al. | |
| 7,008,769 B2 | 3/2006 | Henderson et al. | |
| 7,060,977 B1 | 6/2006 | Dupeyrat et al. | |
| 7,081,624 B2 | 7/2006 | Liu et al. | |
| 7,102,656 B2 | 9/2006 | Mirkin et al. | |
| 7,281,419 B2 * | 10/2007 | Wang et al. ..................... | 73/105 |
| 7,361,310 B1 | 4/2008 | Mirkin et al. | |
| 2002/0122873 A1 | 9/2002 | Mirkin et al. | |
| 2003/0007242 A1 | 1/2003 | Schwartz et al. | |
| 2003/0022470 A1 | 1/2003 | Liu et al. | |
| 2003/0049381 A1 | 3/2003 | Mirkin et al. | |
| 2003/0068446 A1 | 4/2003 | Mirkin et al. | |
| 2003/0162004 A1 | 8/2003 | Mirkin et al. | |
| 2003/0185967 A1 | 10/2003 | Eby et al. | |
| 2004/0008330 A1 | 1/2004 | Mirkin et al. | |
| 2004/0026681 A1 | 2/2004 | Cruchon-Dupeyrat et al. | |
| 2004/0101469 A1 | 5/2004 | Demers | |
| 2004/0227075 A1 * | 11/2004 | Liu et al. ..................... | 250/306 |
| 2005/0255237 A1 | 11/2005 | Zhang et al. | |
| 2006/0014001 A1 | 1/2006 | Zhang et al. | |

FOREIGN PATENT DOCUMENTS

| EP | 1388369 A2 | 2/2004 |
|---|---|---|
| WO | WO 00/41213 | 7/2000 |
| WO | WO 01/91855 | 12/2001 |

OTHER PUBLICATIONS

Weinberger, D.A. et al., "Combinatorial Generation and Analysis of Nanometer- and Micrometer-Scale Silicon Features via 'Dip-Pen' Nanolithography and Wet Chemical Etching", Advanced Materials, vol. 12, No. 21, 1600-1603, Nov. 2, 2000.*
Demers et al., "Drug Discovery," *Genetic Engineering News*, vol. 23, No. 15, Sep. 1, 2003, 32.
Gates et al., "New Approaches to Nonfabrication: Molding, Printing, and Other Techniques," *Chem. Rev.* 105, 1171-1196 (2005).
Geissler et al, "Defect-Tolerant and Directional Wet-Etch Systems for Using Monolayers as Resists," *Langmuir*, 18, 2374-2377 (2002).
Ginger et al., "The Evolution of Dip-Pen Nanolithography," *Angew. Chem. Int. Ed.* 43, 30-45 (2004).
Hong et al., "A Nanoplotter With Both Parallel and Serial Writing Capabilities," *Science* 288, 1808-1811 (2000).
King et al., "Design of Atomic Force Microscope Cantilevers for Combined Thermomechanical Writing and Thermal Reading in Array Operation," *J. Microelectromech. Syst.* 2002, 11, No. 6, 765-774.
Madou, *Fundamentals of Microfabrication*, 2$^{nd}$ Ed., pp. 484-494, 2002.
Minne et al., "Independent Parallel Lithography Using the Atomic Force Microscope," *J. Vac. Sci. & Tech. B* 14, 2456-2461 (1996).
Minne et al., "Centimeter Scale Atomic Force Microscope Imaging and Lithography," *Appl. Phys. Lett.* 73, 12 1742-1744 (1998).
Piner et al., "'Dip-Pen' Nanolithography," *Science* 283, 661-663 (1999). Piqué et al., "Direct-Write Technologies for Rapid Prototyping Applications: Sensors, Electronics, and Integrated Power Sources," (Eds), 2002.
Salaita et al., "Sub-100 nm, Centimeter-Scale, Parallel Dip-Pen Nanolithography," *Small* 1, 940-945 (2005).
Tseng et al., "Nanofabrication by Scanning Probe Microscope Lithography: A Review," *J. Vac. Sci. & Tech. B* 23 (3), 877-894, (2005).
Van Zant, *Microchip Fabrication a Practical Guide to Semiconductor Processing*, McGraw-Hill 5th Ed., 2004.
Vettiger et al., "The 'Millipede'—More Than One Thousand Tips for Future AFM Data Storage," *IBM J. Res. Dev.* vol. 44, No. 3, 323-341, 2000.
Vettiger et al., "The 'Millipede'—Nanotechnology Entering Data Storage," *IEEE Transactions on Nanotechnology*, vol. 1, No. 1, 39-55, Mar. 2002.
Wenzler et al., "Improvements to Atomic Force Microscopy Cantilevers for Increased Stability," *Rev. Sci. Instrum.*, vol. 67, No. 12, 4191-4197 (Dec. 1996).
Xia et al., "A Selective Etching Solution for Use With Patterned Self-Assembled Monolayers of Alkanethiolates on Gold," *Chemistry of Materials*, 7, 2332-2337 (1995).
Zhang et al., "Fabrication of Sub-50-nm Solid-State Nanostructures on the Basis of Dip-Pen Nanolithography," *Nano Letters*, vol. 3, No. 1, 43-45, 2003.
Zhang et al., "A Massively Parallel Electrochemical Approach to the Miniaturization of Organic Micro- and Nanostructures on Surfaces," *Langmuir*, 20, 962-968 (2004).
IBM Corp., "Dot Matrix Printhead Module", IBM Technical Disclosure Bulletin, vol. 32, No. 3A, Aug. 1989, pp. 446-447.
International Search Report and Written Opinion of PCT/US2007/007186, May 9, 2007.

* cited by examiner

*Primary Examiner* — Daniel Larkin
(74) *Attorney, Agent, or Firm* — Foley & Lardner LLP

(57) ABSTRACT

Massive parallel printing of structures and nanostructures at high speed with high resolution and high quality using two dimensional arrays comprising cantilevers and tip-based transfer of material to a surface. The array is designed so only tips touch the surface. This can be accomplished by long tips and bent cantilevers and alignment. An article comprising: a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips have an apex height relative to the cantilever of at least four microns, and a support for the array. Combinatorial arrays and bioarrays can be prepared. The arrays can be manufactured by micromachining methods.

32 Claims, 10 Drawing Sheets

MASSIVELY PARALLEL LITHOGRAPHY WITH TWO-DIMENSIONAL PEN ARRAYS

RELATED APPLICATIONS

This application claims the priority benefit of U.S. provisional application Ser. No. 60/792,950 filed Apr. 19, 2006 to Mirkin et al., which is hereby incorporated by reference.

FEDERAL FUNDING STATEMENT

The present invention was developed with use of federal funding from the following grant agencies and grant numbers: Air Force Office Scientific Research, AFOSR FA9550-05-1-0348; AFOSR 28065-3/W911NF-04-1-071; and National Institutes of Health NIH DPI 0D000285-02. The federal government reserves rights in the invention.

BACKGROUND

Dip-Pen Nanolithographic® (DPN)® printing has been developed in various embodiments as a scanning probe-based technique that uses, at least in some embodiments, a coated sharp tip such as an atomic force microscope (AFM) tip to pattern surfaces on, for example, the sub-50 nm to many micrometer length scale (see, for example, Piner et al. *Science* 283, 661-663 (1999)). This novel printing technique in its various embodiments can combine soft matter compatibility with the high resolution of scanning probe and AFM methods, thereby affording unique opportunities to use micro- and nano-patterned substrates in a variety of fields ranging from molecular electronics to biomedicine. However, an obstacle in commercially utilizing DPN printing for some applications has been its relatively low throughput (see, for example, Hong et al. *Science* 288, 1808-1811 (2000); Salaita et al. *Small* 1, 940-945 (2005)), a limitation associated with the field of scanning probe lithography in general (see, for example, Gates et al. *Chem. Rev.* 105, 1171-1196 (2005); Tseng et al., *J. Vac. Sci. & Tech. B* 23, 877-894 (2005)). In particular, the DPN method is generally used as a serial method rather than a parallel method, and the exponential complexity and cost arising from individually addressed feedback systems can constrain its accessibility and the rate of patterning. Therefore, a commercial need exists to improve throughput of the DPN method while maintaining its simplicity.

In many cases, the lithography has been to date carried out with one pen on one instrument to transfer a patterning compound or material to the surface. However, one approach has been to use multiple pen systems wherein multiple pens operate in parallel on one instrument. For example, WO 00/41213 to Mirkin et al. describes use of a plurality of tips with a single device, referring to U.S. Pat. No. 5,666,190 to Quate et al. (Stanford) for descriptions of cantilever arrays and nanolithographic application. In addition, WO 01/91855 to Mirkin et al. describes working examples with a plurality of tips, wherein a linear array of eight tips were obtained from a larger wafer block of tips and affixed to a ceramic tip carrier and mounted to an AFM tip holder with epoxy glue.

Salatia et al. *Small*, 2005, 1, No. 10, 940-945 describe parallel printing with 250 pen arrays, 26 pen arrays, and blocks of 26 pen arrays. U.S. Pat. No. 6,642,129 to Liu et al. describes parallel individually addressable probes for nanolithography including linear arrays and two dimensional arrays. The review by Ginger et al. *Angew. Chem. Int. Ed.* 43, 30-45 (2004)) describes 10,000 pen systems.

Massively parallel nanoarray platforms have been noted including a system with 1.2 million pens per four inch diameter wafer. See, for example, Demers et al., *Genetic Engineering News*, vol. 23, no. 15, Sep. 1, 2003, 32.

Parallel probes have also been developed by IBM. See for example, Vettiger et al., *IBM J. Res. Dev.* 2000, 44, 323; King et al., *J. Microelectromech. Syst.* 2002, 11, 765. See also U.S. Pat. No. 5,835,477 to Binnig et al.

However, a need yet exists to improve this approach in view of, for example, the difficulties associated with fabricating large numbers of pens in a confined space including in two dimensional arrays and in adapting the pens to a larger or customized instrument to control the printing process. For example, leveling and alignment of massive numbers of cantilevers and tips is an engineering challenge. The pens must be efficiently produced so that as many of the pens as possible are usable. Fabrication should be convenient, and the pens should be robust for commercial use with a variety of patterning compounds and materials. High rates of patterning structures, including nanostructures, are needed at high resolution and registration. While multiple pen systems have been used for patterning, the number of dots generated by contact has typically been the same as the number of pens. Otherwise, no registration exists between the two sets of dots. A need exists to better demonstrate the writing capabilities of large pen systems including better registration and alignment.

SUMMARY

The present invention comprises a plurality of different embodiments.

For example, one embodiment comprises a two-dimensional array of a plurality of cantilevers, the cantilevers comprising tips at the cantilever ends, wherein the array is adapted to prevent substantial contact of non-tip components of the array when the tips are brought into contact with a substantially planar surface.

Another embodiment comprises an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the array is adapted to prevent substantial contact of non-tip components of the array when the tips are brought into contact with a substantially planar surface; and (ii) a support for the array.

Another embodiment comprises an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the array is adapted to prevent substantial contact of non-tip components of the array when the tips are brought into contact with a substantially planar surface.

In another embodiment, the invention provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, and wherein the tips have an apex height relative to the cantilever of at least, for example, four microns, and a support for the array.

Another embodiment provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, and wherein the tips are coated with metal on the tip side of the cantilever and the cantilevers are bent at an angle of at least, for example, 10° from their base.

In another embodiment, the invention provides, for example, a method of making an article, wherein the article comprises a two-dimensional array of a plurality of cantilevers, and a support for the array, the method comprising: (i) forming a two dimensional array comprising a plurality of cantilevers comprising tips at their ends, wherein the cantilevers are supported on a sacrificial support structure; (ii) forming an array support comprising a plurality of base rows which are adapted for bonding to the two dimensional array comprising a plurality of cantilevers; (iii) bonding the cantilevers to the base rows; and (iv) removing the support structure to release the cantilevers and form the array.

Still further, another embodiment is a method comprising (1) micromachining a two dimensional array of cantilevers wherein the cantilevers are adapted to bond with a device which both supports the cantilevers and can also couple the cantilevers to an instrument for motion, and (2) bonding the cantilevers to the device.

Also provided are instruments comprising the two dimensional arrays and support structures and methods of building and using the instruments, including for fabrication of micron-scale and nanometer scale structures.

Also provided are patterned substrates made from the arrays, devices, and instruments described herein.

Also provided are methods for fast patterning of nanostructures including, for example, at least 100,000 or at least 1,000,000 nanostructures per minute.

In a preferred embodiment, a solution is provided to the throughput limitation through the use of novel 55,000-pen two-dimensional arrays in the context of parallel DPN printing experiments for patterning, for example, gold substrates with sub-100 nm resolution over large, square centimeter areas.

This new approach to parallel scanning probe lithography over large areas can be contrasted with the work of others, which has focused on the production of linear and two-dimensional cantilever arrays with independent feedback systems, for the controlled oxidation (see, for example, Minne et al. *J. Vac. Sci. & Tech. B* 14, 2456-2461 (1996); Minne et al. *Appl. Phys. Lett.* 73, 1742-1744 (1998)) or melting of an underlying substrate (see, for example, Vettiger et al. *IEEE Trans. Nanotechnology* 1, 39-55 (2002)).

Notably, if feedback is not used, the lack of feedback systems coupled with the ability to pattern a surface with molecule-based inks can make this massively parallel DPN capability highly accessible and attractive for high throughput nanofabrication experiments and commercialization involving, for example, both soft organic and hard inorganic materials. It can be particularly useful, for example, for fabricating combinatorial libraries of structures and duplicates of a desired nanostructure or particular type of nanopatterned substrate.

DETAILED DESCRIPTION

Introduction/DPN Printing

Figure 1:
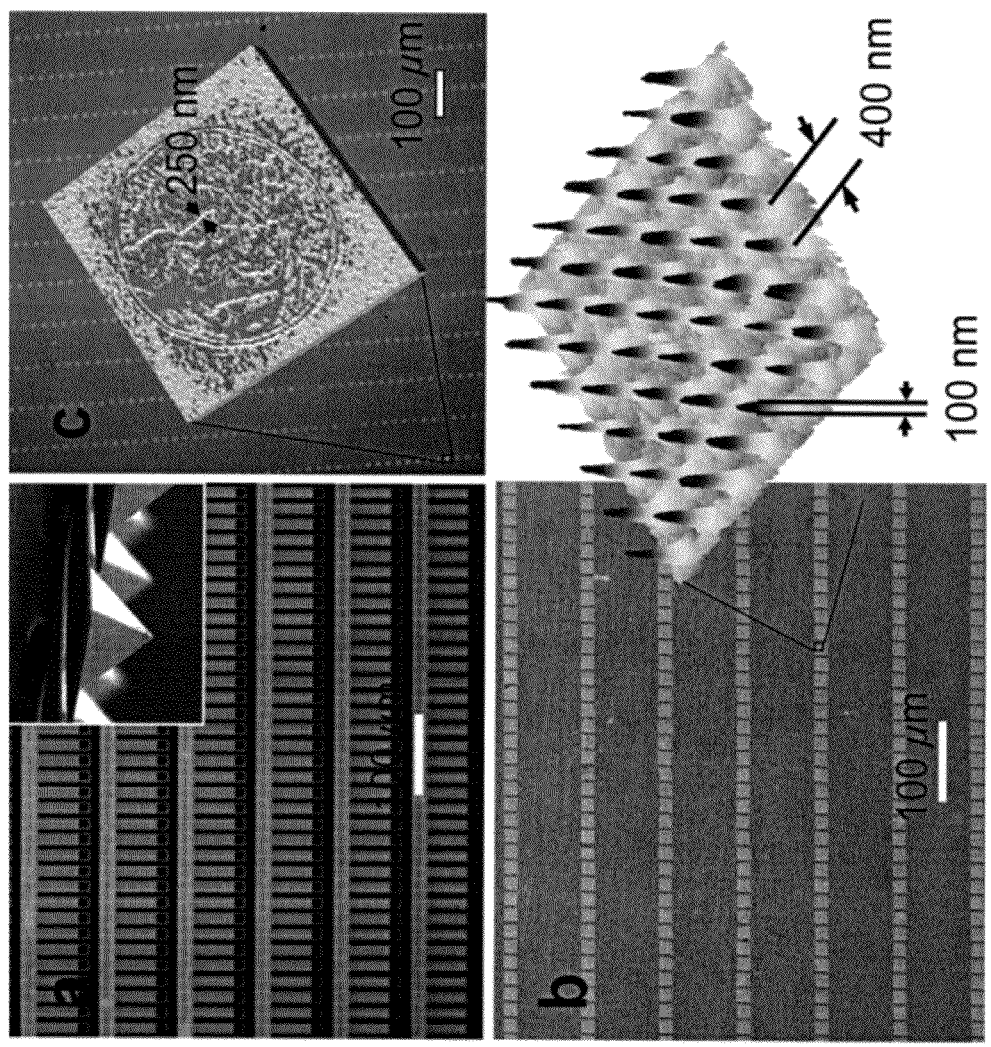
FIG. 1. DPN patterning with 55,000 AFM cantilevers in parallel: (a) Optical micrograph of part of the 2D array of cantilevers used for patterning. Inset shows an SEM image of the tips. (b) Large area SEM image (left) of part of an 88,000,000 gold dot array (40×40 within each block) on an oxidized silicon substrate. A representative AFM topographical image (right) of part of a block. (c) Representative optical micrograph (inset shows AFM image) of ~55,000 features drawn in the form of the face of the 2005 US five cent coins. The coin bears a picture of Thomas Jefferson, who helped develop the polygraph, a macroscopic letter duplicator that relies on an array of pens.

References will be made in detail to the preferred embodiments, examples of which are illustrated in the accompanying drawings. While the many facets of the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims and equivalents thereof.

Priority U.S. provisional application Ser. No. 60/792,950 filed Apr. 19, 2006 to Mirkin et al. is hereby incorporated by reference.

For practice of the various embodiments described herein, lithography, microlithography, and nanolithography instruments, pen arrays, active pens, passive pens, inks, patterning compounds, kits, ink delivery, software, and accessories for direct-write printing and patterning can be obtained from NanoInk, Inc., Chicago, Ill. Software includes INKCAD software (NanoInk, Chicago, Ill.), providing user interface for lithography design and control. E-Chamber can be used for environmental control. Dip Pen Nanolithography™ and DPN™ are trademarks of NanoInk, Inc.

The following patents and co-pending applications related to direct-write printing with use of cantilevers, tips, and patterning compounds are hereby incorporated by reference in their entirety and can be used in the practice of the various embodiments described herein, including inks, patterning compounds, software, ink delivery devices, and the like:

1. U.S. Pat. No. 6,635,311 to Mirkin et al., which describes fundamental aspects of DPN printing including inks, tips, substrates, and other instrumentation parameters and patterning methods;
2. U.S. Pat. No. 6,827,979 to Mirkin et al., which further describes fundamental aspects of DPN printing including software control, etching procedures, nanoplotters, and complex and combinatorial array formation.
3. U.S. patent publication number 2002/0122873 A1 published Sep. 5, 2002 ("Nanolithography Methods and Products Produced Therefor and Produced Thereby"), which describes aperture embodiments and driving force embodiments of DPN printing.
4. U.S. regular patent application Ser. No. 10/366,717 to Eby et al., filed Feb. 14, 2003 ("Methods and Apparatus for Aligning Patterns on a Substrate"), which describes alignment methods for DPN printing (published Oct. 2, 2003 as 2003/0185967).
5. U.S. regular patent application Ser. No. 10/375,060 to Dupeyrat et al., filed Feb. 28, 2003 ("Nanolithographic Calibration Methods"), which describes calibration methods for DPN printing.
6. U.S. Patent Publication 2003/0068446, published Apr. 10, 2003 to Mirkin et al. ("Protein and Peptide Nanoarrays"), which describes nanoarrays of proteins and peptides;
7. U.S. Regular patent application Ser. No. 10/307,515 filed Dec. 2, 2002 to Mirkin et al. ("Direct-Write Nanolithographic Deposition of Nucleic Acids from Nanoscopic Tips"), which describes nucleic acid patterning (PCT/US2002/038252 published Jun. 12, 2003).
8. U.S. Regular patent application Ser. No. 10/320,721 filed Dec. 17, 2002 to Mirkin et al. ("Patterning of Solid State Features by Direct-Write Nanolithographic Printing"), which describes reactive patterning and sol gel inks (now published Aug. 28, 2003 as 2003/0162004).
9. U.S. Pat. Nos. 6,642,129 and 6,867,443 to Liu et al. ("Parallel, Individually Addressable Probes for Nanolithography"), describing active pen arrays.
10. U.S. Patent Publication 2003/0007242, published Jan. 9, 2003 to Schwartz ("Enhanced Scanning Probe Microscope and Nanolithographic Methods Using Same").
11. U.S. Patent Publication 2003/0005755, published Jan. 9, 2003 to Schwartz ("Enhanced Scanning Probe Microscope").
12. U.S. patent application Ser. No. 10/637,641 filed Aug. 11, 2003, now published as 2004/0101469, describing catalyst nanostructures and carbon nanotube applications.
13. U.S. patent application Ser. No. 10/444,061 filed May 23, 2003, now published as 2004/0026681 published Feb. 12, 2004, and US patent publication 2004/0008330 published Jan. 15, 2004, describing printing of proteins and conducting polymers respectively.
14. U.S. patent application Ser. No. 10/647,430 filed Aug. 26, 2003, now U.S. Pat. No. 7,005,378, describing conductive materials as patterning compounds.
15. U.S. patent application Ser. No. 10/689,547 filed Oct. 21, 2003, now published as 2004/0175631 on Sep. 9, 2004, describing mask applications including photomask repair.
16. U.S. patent application Ser. No. 10/705,776 filed Nov. 12, 2003, now published as 2005/0035983 on Feb. 17, 2005, describing microfluidics and ink delivery.
17. U.S. patent application Ser. No. 10/788,414 filed Mar. 1, 2004, now published as 2005/0009206 on Jan. 13, 2005 describing printing of peptides and proteins.
18. U.S. patent application Ser. No. 10/893,543 filed Jul. 19, 2004, now published as 2005/0272885 on Dec. 8, 2005, describing ROMP methods and combinatorial arrays.
19. U.S. patent application Ser. No. 11/056,391 filed Feb. 14, 2005, now published as 2005/0255237 published on Nov. 17, 2005, describing stamp tip or polymer coated tip applications.
20. U.S. patent application Ser. No. 11/065,694 filed Feb. 25, 2005, now published as 2005/0235869 on Oct. 27, 2005, describing tipless cantilevers and flat panel display applications.
21. US Patent publication 2006/001,4001 published Jan. 19, 2006 describing etching of nanostructures made by DPN methods.
22. WO 2004/105046 to Liu & Mirkin published Dec. 2, 2004 describes scanning probes for contact printing.

All references cited in 1-20 above are incorporated by reference and the teachings therein can be adapted for use with the various embodiments described herein.

DPN methods are also described in Ginger et al., "The Evolution of Dip-Pen Nanolithography," *Angew. Chem. Int. Ed.* 2004, 43, 30-45, including description of high-throughput parallel methods.

Direct write methods, including DPN printing and pattern transfer methods, are described in for example *Direct-Write Technologies, Sensors, Electronics, and Integrated Power Sources*, Pique and Chrisey (Eds), 2002.

The direct-write nanolithography instruments and methods described herein are particularly of interest for use in preparing bioarrays, nanoarrays, and microarrays based on peptides, proteins, nucleic acids, DNA, RNA, viruses, biomolecules, and the like. See, for example, U.S. Pat. No. 6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications. Combinatorial arrays can be prepared. See also, for example, U.S. Pat. Nos. 7,008,769; 6,573,369; and 6,998,228 to Henderson et al.

Scanning probe microscopy is reviewed in Bottomley, *Anal. Chem.*, 1998, 70, 425R-475R. Also, scanning probe microscopes are known in the art including probe exchange mechanisms as described in, for example, U.S. Pat. No. 5,705,814 (Digital Instruments).

Two Dimensional Arrays

One embodiment is an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the arrays are adapted to prevent substantial contact of non-tip components of the array when the tips are brought into contact with a substantially planar surface; and (ii) a support for the array. One particular embodiment is illustrated in the non-limiting working examples and figures.

One embodiment also provides an article comprising: (i) a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips have an apex height relative to the cantilever of at least, for example, four microns, and (ii) a support for the array. One particular embodiment is illustrated in the non-limiting working examples and figures.

Another embodiment provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips are coated with metal on the tip side of the cantilever and the cantilevers are bent at an angle of, for example, at least 10° from their base. One particular embodiment is illustrated in the non-limiting working examples and figures.

Two-dimensional arrays of cantilevers are known in the art. For example, the two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated by combining two parts, each part having a surface which is patterned in two dimensions and adapted to be mated with each other in the two dimensions.

One important variable is the fraction or percentage of the cantilevers in the array which can actually function for the intended purposes. In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long tips. Factors which can be useful to achieve this result include use of long tips, bending of the cantilever arms, tip leveling, row leveling, and leveling of the cantilevers in all dimensions. One or more combination of factors can be used.

The cantilever tips can be longer than usual in the art. For example, the tips can have an apex height relative to the cantilever of at least four microns on average, and if desired, the tips can have an apex height relative to the cantilever of at least seven microns on average. In addition, tip apex height can be at least 10 microns, or at least 15 microns, or at least 20 microns. No particular upper limit exists and technology known in the art and improving can be used. This long length can help ensure that only tips are contacting the surface. Apex height can be taken as an average of many tip apex heights, and in general, apex height is engineered not to vary substantially from tip to tip. Methods known in the art can be used to measure tip apex height including methods shown in the working examples.

In measuring parameters for the array, average measurements can be used. Average measurements can be obtained by methods known in the art including for example review of representative images or micrographs. The entire array does not need to be measured as that can be impractical.

Tipless cantilevers can be used in some embodiments, although not a preferred embodiment. For example, one embodiment provides an article comprising: (i) a two-dimensional array of a plurality of cantilevers, wherein the array comprises a plurality of base rows, each base row comprising a plurality of cantilevers extending from the base row, wherein each of the cantilevers are tipless cantilevers, wherein the cantilevers are bent at an angle from their base.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle for example of at least 5° from their base, or at least 10° from their base, or at an angle of at least 15° from their base. Methods known in the art can be used to measure this including the methods demonstrated in the working examples. Average value for angle can be used. The cantilevers can be bent on average about 10 microns to about 50 microns, or about 15 microns to about 40 microns. This distance of bending can be measured by methods known in the art including the methods demonstrated in the working examples. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In preferred embodiments, the array can be adapted so that the cantilevers are both bent toward the surface and also comprise tips which are longer than normal compared to tips used merely for imaging.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be for example a solid tip or a hollow tip. WO 2005/115630 (PCT/US2005/014899) to Henderson et al. describes tip geometries for depositing materials onto surfaces which can be used herein.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 10,000 per square inch, or at least 40,000 per square inch, or at least 70,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns in one dimension, and about 5 microns to about 35 microns in the second dimension. There is no particular lower limit on tip spacing as fabrication methods will allow more dense tip spacing over time. Examples of lower limits include 1 micron, or 5 microns, or 10 microns so for example tip spacings can be one micron to 300 microns, or one micron to 100 micron.

The number of cantilevers on the two dimensional array is not particularly limited but can be at least about three, at least about five, at least about 250, or at least about 1,000, or at least about 10,000, or at least about 50,000, or at least about 55,000, or at least about 100,000, or about 25,000 to about 75,000. The number can be increased to the amount allowed for a particular instrument and space constraints for patterning. A suitable balance can be achieved for a particular application weighing for example factors such as ease of fabrication, quality, and the particular density needs.

The tips can be engineered to have consistent spacing for touch the surface consistently. For example, each of the tips can be characterized by a distance D spanning the tip end to the support, and the tip array is characterized by an average distance D' of the tip end to the support, and for at least 90% of the tips, D is within 50 microns of D'. In another embodiment, for at least 90% of the tips, D is within 10 microns of D'. The distance between the tip ends and the support can be for example about 10 microns to about 50 microns. This distance can comprise for example the additive combination of base row height, the distance of bending, and the tip height.

Base row length is not particularly limited. For example, the base rows can have an average length of at least about 1 mm. Average length for base row can be, for example, about 0.1 mm to about 30 mm, or about 0.1 mm to about 15 mm, or about 0.1 mm to about 5 mm, or about 0.5 mm to about 3 mm.

The base rows can have a height with respect to the support of at least about 5 microns. This height is not particularly limited but can be adapted for use with the appropriate cantilever bending.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

A variety of methods can be used for bonding the cantilevers to the base, and the methods are not particularly limited. Bonding methods are described for example in Madou, *Fundamentals of Microfabrication*, $2^{nd}$ Ed., pages 484-494 which describes for example field-assisted thermal bonding, also known as anodic bonding, electrostatic bonding, or the Mallory process. Methods which provide low processing temperature can be used. For example, the cantilevers can be bound to the base by a non-adhesive bonding. Bonding examples include electrostatic bonding, field-assisted thermal bonding, silicon fusion bonding, thermal bonding with intermediate layers, eutectic bonding, gold diffusion bonding, gold thermocompression bonding, adhesive bonding, and glass frit bonding.

The cantilevers can be engineered so they are not adapted for feedback including force feedback. Alternatively, at least one cantilever can be adapted for feedback including force feedback. Or substantially all of the cantilevers can be adapted for feedback including force feedback. For example, over 90%, or over 95%, or over 99% of the cantilevers can be adapted for feedback including force feedback.

The cantilevers can be bound to the base by electrostatic binding.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example 100 nm to about 700 nm, or about 250 nm to about 550 nm. Tipless cantilevers can be used in the arrays, the methods of making arrays, and the methods of using arrays.

The cantilevers can be supported on the base rows, and the base rows in turn can be supported on a larger support for the array. The base rows can extend from the larger support for the array. The array support can be characterized by a surface area which is about two square cm or less, or alternatively about 0.5 square cm to about 1.5 square cm. The size can be adjusted as needed for coupling with an instrument.

Arrays can be adapted for passive pen or active pen use. Control of each tip can be carried out by piezoelectric, capacitive, or thermoelectric actuation, for example.

The arrays can be adapted for integration of tip coating and ink delivery. For example, microfluidics can be used to control inking and coating of the tips. Tips can be dipped into devices or ink can be delivered directly through internal regions of the tip for hollow tip embodiments.

The tips can be coated with a patterning compound or ink material. The coating is not particularly limited; the patterning compound or ink material can be disposed at the tip end. Patterning compounds and materials are known in the art of nanolithographic printing and include organic compounds and inorganic materials, chemicals, biological materials, non-reactive materials and reactive materials, molecular compounds and particles, nanoparticles, materials that form self assembled monolayers, soluble compounds, polymers, ceramics, metals, magnetic materials, metal oxides, main group elements, mixtures of compounds and materials, conducting polymers, biomolecules including nucleic acid materials, RNA, DNA, PNA, proteins and peptides, antibodies, enzymes, lipids, carbohydrates, and even organisms such as viruses. The references described in the INTRODUCTION section describe many patterning compounds which can be used. Sulfur-containing compounds including thiols and sulfides can be used.

The methods by which the tips can be coated can include for example solution dipping or vacuum evaporation, as well as the microfluidic methods noted above. See U.S. patent application Ser. No. 10/705,776 filed Nov. 12, 2003, now published as 2005/0035983 on Feb. 17, 2005.

Methods of Making Two Dimensional Arrays

Figure 2:
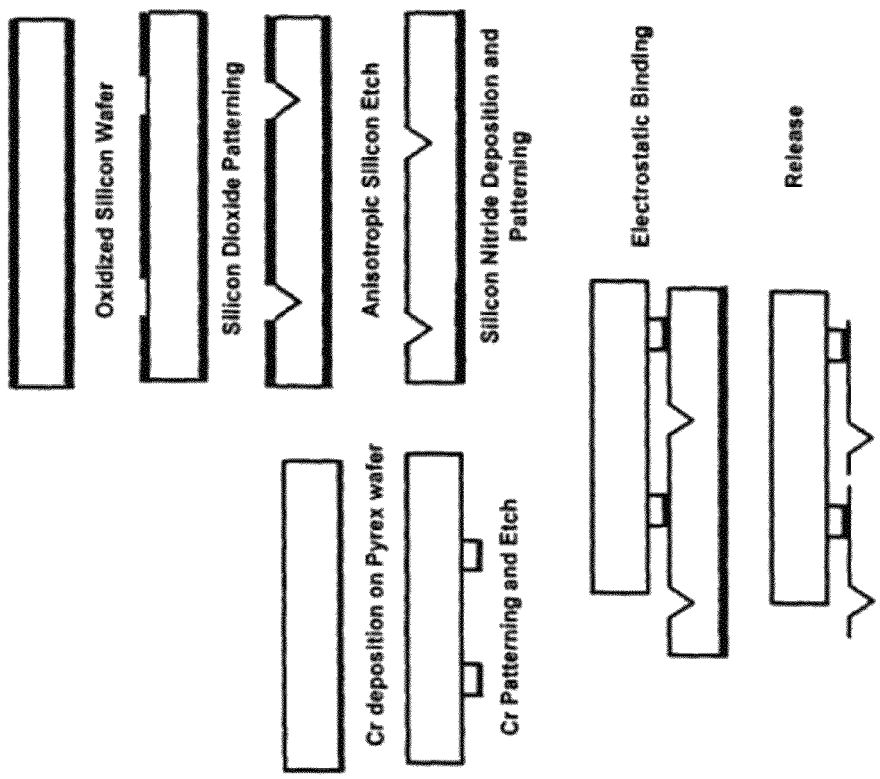
FIG. 2. A schematic diagram of the fabrication process for 2D cantilever arrays.

Another embodiment comprises a method of making two dimensional arrays. For example, an embodiment comprises a method of making article, wherein the article comprises a two-dimensional array of a plurality of cantilevers, and a support for the array, the method comprising: (i) forming a two dimensional array comprising a plurality of cantilevers comprising tips at their ends, wherein the cantilevers are supported on a sacrificial support structure; (ii) forming an array support comprising a plurality of base rows which are adapted for bonding to the two dimensional array comprising a plurality of cantilevers; (iii) bonding the cantilevers to the base rows; and (iv) removing the support structure to release the cantilevers and form the array. The non-limiting working examples below provide one method for executing these steps. See FIG. 2. In FIG. 2, the structure shown as "electrostatic binding" comprises patterned cantilevers (patterning not shown).

In some embodiments, tipless cantilevers can be fabricated.

The above description for the article comprising the two dimensional arrays and support can be also applied to the methods making the two dimensional arrays. For example, in the method of making, the tips can be adapted to prevent substantial contact of non-tip components of the array when the tips are brought into contact with a substantially planar surface. In the method of making, the tips can have an apex height relative to the cantilever of at least four microns, or at least seven microns. In the method of making, the method can further comprise the step of bending the cantilevers at an angle away from the support. For example, the method can comprise bending the cantilevers at an angle of at least 10° away from the support. In the method of making, the tips can have an apex height relative to the cantilever of at least four microns, and wherein the cantilevers are bent at an angle away from the support. Also, in the method of making, the tips can have an apex height relative to the cantilever of at least seven microns, and wherein the cantilevers are bent at an angle of at least 10° away from the support.

Microfabrication methods are described extensively in for example Madou, *Fundamentals of Microfabrication,* 2$^{nd}$ Ed., CRC Press, 2002; and Van Zant, *Microchip Fabrication,* 5$^{th}$ Ed., 2004.

In one part of the fabrication method, the two dimensional array can be formed by microfabrication and micromachining methods. The sub-product can comprise the cantilevers supported on a sacrificial support which can be later removed before use. Microfabrication steps including wafers, oxidation, patterning, etching, deposition, deep reactive ion etching (Bosch process) and other steps known for making cantilevers and tips can be used.

In another part of the fabrication method, an array support is formed which is adapted for bonding to the two dimensional array of cantilevers. It can be also adapted for coupling the two dimensional array of cantilevers to the instrument for movement. Base rows can be formed which extend out from the surface of the array support and provide support for the cantilevers upon fabrication.

The cantilevers can be bonded to the base rows. An example of a bonding method is electrostatic bonding.

The sacrificial support for the cantilevers can be removed to free up or release the cantilevers. Methods known in the art can be used to execute this step.

FIG. 2 from the working examples below illustrates a fabrication method, although the parameters and materials described therein can be modified. For example, the 200 nm layer of silicon oxide can be, for example, 100 nm to 300 nm; the 950° C. can be for example 850° C. to 1050° C.; the 30 minutes can be for example 15 minutes to 45 minutes; the 10 micron square openings do not have to be square can be for example 5 microns to 15 microns; the 400 nm silicon nitride layer can be 200 nm to 600 nm, or 300 nm to 500 nm; the 200 nm thick chromium layer can be for example 100 nm to 300 nm; the 100 micron trenches can be for example 50 microns to about 150 microns; the eight micron recesses can be for example 3 microns to 13 microns so as to allow cantilever free movement; and the like.

The working examples also provide a method for annealing pen arrays and the parameters described therein can be modified. For example, the 5 nm Ti adhesion layer can be 2 nm to 20 nm thick, and the 25 nm gold layer can be 5 nm to 100 nm thick. The annealing temperature can be for example 150° C. to about 500° C., and the time for annealing can be for example 30 minutes to 250 minutes.

Also provided is a method comprising (1) micromaching a two dimensional array of cantilevers wherein the cantilevers are adapted to bond with a device which both supports the cantilevers and can also couple the cantilevers to an instrument for motion, and (2) bonding the cantilevers to the device. The device can be called a handle wafer. One side is for bonding to the cantilevers. The other side is for coupling to a larger instrument. The working examples below, for example, also illustrate this embodiment.

Leveling

Level can be carried out to provide leveling in each dimension of the two dimensional array. Leveling can help with adapting the array so only tips contact the surface. The working examples below provide an example of leveling the cantilevers before the two dimensional array of cantilevers are mounted onto an instrument. For example, gravity forces and forces near to gravity forces can be used to level the cantilevers on a sacrificial substrate. External force can be used. Other forces can be used as needed for a particular two dimensional array. For example, forces can be about 0.2 nN/tip to about 2,000 nN/tip, or about 2 nN/tip or about 200 nN/tip, or about 20 nN/tip. The sacrificial substrate can be made as flat as possible and practical for a given application.

The adhesive mounting method also allows one to improve leveling and avoid use of a feedback system if desired.

Optical microscopy can be used to facilitate leveling.

One embodiment provides a method comprising: (i) preparing a two-dimensional array of a plurality of cantilevers, wherein the array comprises a plurality of base rows, each base row comprising a plurality of cantilevers extending from the base row, wherein each of the cantilevers comprise tips at the cantilever end away from the base row, (ii) contacting tips of the array with a sacrificial substrate under pressure, (iii) forming an aligned array on the substrate, and (iv) attaching the aligned array to an instrument adapted for motion of the array. The pressure can be generated either externally or with gravity. The attaching can be an adhesive or mechanical attaching. The method can further comprise removing the sacrificial substrate from the tips of the array.

Mounting the Supported Two Dimensional Arrays on an Instrument

Mounting of arrays to the instrument can be achieved by one or more mechanisms operating individually or in combination. For example, mounting can be carried out with use of mechanical coupling, friction fit or magnetic coupling. Adhesives and glues can be used including fast curing and UV curing systems. Epoxy glue is described below including its use as a gap filler or space filler.

Adhesive mounting can be used to couple the supported two dimensional arrays to an instrument which provides x motion, y motion, z motion, or combinations thereof including x, y, z motion. Motion is provided which allows for high resolution patterning and high resolution such as found with for example scanning probe instruments.

The instrumentation can be also adapted to have the pens stand still and have the substrates move in x, y, and/or z motion.

In a preferred embodiment, the bonding agent functions to both mount the two dimensional array to the instrument and also the facilitate leveling of the tip array.

Instrument

Also provided are instruments including printing and patterning instruments, as well as nanolithography instruments. Instruments can be used which provide both imaging and patterning capability. While the methods and devices herein can be used with scanning probe and AFM instrumentation, the instruments are not so limited. Dispensing instruments and tools for delivering small scale amounts of materials to surfaces are known. See for example U.S. Pat. Nos. 6,024, 925; 6,087,274; 5,981,733;

A preferred example of an instrument for lithography including microlithography and nanolithography is the NScriptor™ from NanoInk (Chicago, Ill.). Commercial AFM instruments can be used.

An instrument is described in U.S. Pat. No. 7,008,769 to Henderson et al.

Using the Two Dimensional Arrays

DPN patterning is describe in the references noted above in the Introduction Section and other references cited herein.

Substrates can be made with massive numbers of micronscale or nanometer-scale structures, or nanostructures, formed at massively fast rates. For example, one important parameter is the rate at which structures can be formed. Using methods described herein, structures can be formed at a rate of at least 100,000 per minute, or at least 1,000,000 structures per minute, and even further at least 2,000,000 structures per minute, and even further at least 3,000,000 structures per minute, and even further at least 4,000,000 structures per minute, and even further at least 5,000,000 structures per minute, and even further at least 10,000,000 structures per minute. For example, structures formed at fast rates can be dot features having a diameter of for example about 25 nm to about 500 nm, or about 50 nm to about 200 nm. The structures can be dots and circles, wherein the tip is not moved in the X-Y direction during deposition of the patterning compound.

Other rate parameters can be used. For example, directwriting can be carried out at a rate of at least 1.0 meter/min, or at least 3.3 meters/min (for example, if the tips are moved at appropriate rates such as for example a rate of 1 um/s). Patterning can be executed at 10,000,000 square microns per hour. Rates can be in some cases determined by the rate of diffusion spreading for one pen with multiplication by the number of pens.

A preferred embodiment comprises a method for directwrite nanolithography comprising: directly writing nanostructures at a rate of at least 100,000 per minute, wherein the directly writing comprises contacting a tip having a patterning compound thereon with a substrate. The rate can be at least 1,000,000 per minute, or at least 4,000,000 per minute. The nanostructures can comprise dots, lines, or substantially complete circles. The nanostructures can comprise dots having diameter about 50 nm to about 1,000 nm. The nanostructures can be separated by a distance between about 50 nm and about 1,000 nm, or about 100 nm to about 750 nm.

Substrates can be coated and patterned with for example at least 25,000,000 structures, or at least 50,000,000 structures, or at least 75,000,000 structures, or at least 1,000,000 structures, or at least 500,000,000 million structures, or at least 1,000,000,000 structures.

An important aspect is that the pattern formed on the substrate substantially matches either (1) a pattern generated with software and made with tip motion, or (2) the pattern of the array when the tips are not moved over the surface.

An important embodiment comprises the elimination of a feedback system. This embodiment, having this eliminated, is a basic and novel feature.

The substrates for patterning can be single layer or multilayer. They can be solids including polymers, glasses, composites, silicon, mica, diamond, ceramics, metals, and various oxides and complex mixtures.

The ink-substrate combination can be selected to provide stable structures. Stability can be enhanced by use of covalent bonding or chemisorption, or electrostatic attraction.

Arrays can be formed of inorganic, organic, or biological materials including nanostructures such as viruses, proteins, carbon nanotubes, nanowires, dendrimers, fullerenes, and the like. Combinatorial arrays can be formed. Each spot in the array can provide the same composition or a different composition compared to the next spot.

Vibration isolation tables can be used. Environmental chambers can be used including nebulizer, real-time sensors for temperature and humidity control, and heating and cooling fans. High resolution optics can be used. Independent three motor leveling can be used. Tip biasing can be used.

If AFM-like instrumentation is used, the mode can be contact mode, non-contact mode, or intermittent contact mode.

Another example of a use can be found in Lenhert et al, "Massively Parallel Dip-Pen Nanolithography of Heterogeneous Supported Phospholipid Multilayer Patterns," Small, 2007, 3, No. 1, 71-75, which is hereby incorporated by reference including FIGS. 1-4, experimental section, and noting references cited therein. The instruments described herein can be used to control multi-bilayer stacking (FIG. 1); phospholipid patterns including fluorophore doping (FIG. 2); parallel writing of multiple inks including for testing membrane fluidity; and generation of fluorescent micrographs.

The various embodiments are further illustrated by the following non-limiting examples.

WORKING EXAMPLES

Using conventional photolithographic techniques, a 55,000 pen two-dimensional array was fabricated (pen yield>98%; pen spacing 90×20 μm, FIG. 1a). The challenge of leveling all 55,000 pens over a substrate during a patterning experiment was overcome, without the need for independent feedback on each tip. Several important parameters were developed.

First, arrays of $Si_3N_4$ (or silicon rich nitride material) cantilevers with pyramidal tips were fabricated such that the tips are about three times larger than conventional silicon nitride AFM tips (the apex of each tip was 7.6±0.2 μm taller than its cantilever base).

Second, the cantilevers were bent at a ~20° angle from their base by coating them with 25 nm of Au (and 5 nm Ti adhesion layer) and then annealing at 300° C. This curvature is a result of the different thermal expansion coefficients of $Si_3N_4$ and Au (see, for example, Wenzler, et al. T. P. Rev. Sci. Instrum. 67, 4191-4197 (1996)). This array architecture leads to greater tolerance to the substrate morphology and inherent tip misalignment within the array (±10 μm misalignment can be compensated).

Third, gravity (~20 nN/tip), instead of a complex set of feedback systems, was used to bring all of the tips in contact with a sacrificial substrate prior to use.

Finally, the tip array was locked into position with respect to the piezo scanner head by taking advantage of the malleability of a rapidly curing epoxy resin (see supplementary information). This alignment procedure was useful so all of the tips within the array could be engaged and disengaged in a deliberate and controlled fashion without a feedback system. Once engaged, the pen array can be used to directly write virtually any pattern of molecules on the underlying substrate and simultaneously generate ~55,000 duplicates.

To test the writing capabilities of the pen array, its cantilevers were uniformly coated with 1-octadecanethiol (ODT) by vapor deposition and subsequently used to pattern a 25 nm film of polycrystalline gold on an oxidized silicon substrate with a 5 nm Ti adhesion layer. Using ODT as a chemical etch resist, the molecular patterns were developed into gold nanostructures, allowing the use of an optical or scanning electron microscope to characterize the patterns over large areas. In an initial experiment, the 55,000 pen array was used to generate ~88 million dot features (each tip generating 1,600 100±20 nm dots in a 40×40 array) in less than 20 min (FIG. 1b). Significantly, >99% of all the pens (excluding 1-2% of pens damaged during processing) are in operation. AFM and SEM images confirm that registry and alignment are maintained within the field of view of each tip and between tips as well. One can even generate very sophisticated structures using this approach along with integrated software that controls the relative movement of the tip array over the underlying substrate. Indeed, the likeness of Thomas Jefferson was taken from a 2005 United States five cent coin and duplicated ~55,000 times at a pixel resolution of 80 nm (FIG. 1c).

Materials. Gold substrates were prepared according to literature procedures. (Weinberger et al., *Advanced Materials*, 12, 1600 (2000); Zhang et al., *Langmuir*, 20, 962-968 (2004). 1-octadecanethiol (ODT) (98%) and 1-octanol (99%) were purchased from Aldrich Chemical Co. $Fe(NO_3)_3 9H_2O$ (99%) was purchased from Acros Chemicals, thiourea (ACS grade) was purchased from Fisher Scientific, and ethanol (ACS/USP grade) was purchased from Pharmco Products Inc. 5-min epoxy gel was purchased from Devcon and used as specified by the manufacturer. All chemicals were used as received.

Fabrication of 55,000 Cantilever Arrays: The Microfabrication process used to generate the tips was designed to be simple and robust, which affords high yields and is amenable for future modifications (FIG. 2). A 200 nm layer of silicon oxide was thermally grown (950° C., 30 min) on a silicon <100> wafer and lithographically patterned with 10 micron square openings at a spacing of 90×20 microns. The oxide patterns were then used as an etch mask for an anisotropic silicon etch (37% KOH, 20 min) to form pyramidal tip molds in the silicon wafer. The oxide etch mask was removed in buffered HF (6:6:1 $H_2O:NH_4F:HF$, 5 min), and a 400 nm thick thin film of $Si_3N_4$ was deposited using a low pressure, low stress chemical vapor deposition process. The $Si_3N_4$ layer on the front side of the wafer was then lithographically patterned to form arrays of cantilevers. No oxide layer remains on the backside.

Figure 3:
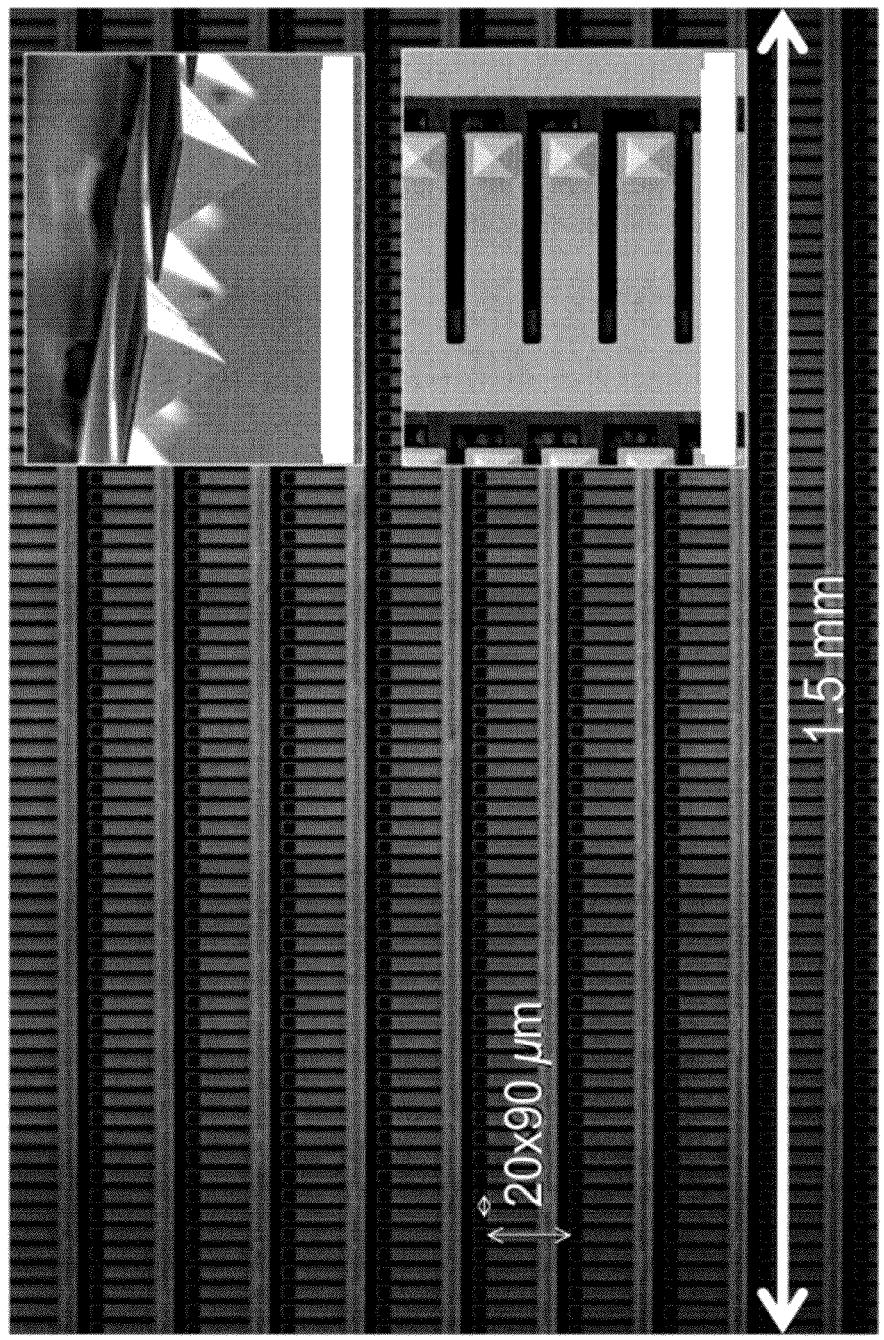
FIG. 3. Optical micrograph of part of a 2D 55,000 pen array. Insets are SEM images of the pen array from side view (top), and top view (bottom), respectively.

Separately, a Pyrex wafer was coated with a 200 nm thick chromium layer and lithographically patterned to form 100 micron rectangular trenches. The Pyrex was etched in a reactive ion etcher, forming 8 micron recesses to allow the cantilevers free movement, and the chromium was then removed. The nitrided silicon wafer and the Pyrex wafer were then electrostatically bonded, and the back of the Pyrex wafer was scribed into 1 $cm^2$ substrates by a diamond saw. Finally, the silicon wafer was etched, leaving the nitrided tip arrays attached to the Pyrex. The resulting cantilever structures were characterized by optical and electron microscopy (FIG. 3). The measured radius of curvature for fabricated tip arrays was 60 nm±20 nm.

The force constant (k) of a fixed-free cantilever beam with a length, width, and thickness of l, w, and t is given by $k=Ewt^3/4l^3$ (1), under a small displacement assumption. The term E denotes the modulus of elasticity of the probe material. The approximate modulus of elasticity is 145 GPa for the thin film of low-stress deposited layer of $Si_3N_4$. The cantilevers had measured dimensions of l=45 microns, w=14.5 microns, and t=400 nm, which correspond to a force constant k=0.40±0.10 N/m. Annealing of pen arrays. To induce tip curling away from the cantilever base, the tip-side of the cantilevers were first coated with a 5 nm Ti adhesion layer and 25 nm Au using a BOC 306 Edwards vacuum evaporator operated at a base pressure below 5×10-7 mbar. Subsequently, the pen arrays were placed in an oven, held at 300° C. for 2 hr, and then slowly cooled to room temperature at a rate <5° C./min. The degree of cantilever bending was inspected by optical microscopy and quantitatively measured by SEM. Although annealing the pen arrays at 400° C. induced a larger degree of cantilever bending, the high temperature also resulted in coarsening of the gold grains due to enhanced Au diffusion. Therefore, 300° C. was chosen as the annealing temperature. Cantilever bending is caused by the different thermal expansion of gold ($\alpha_{Au}=13.8\times10^{-6}$ C.$^{-1}$) and $Si_3N_4$ ($\alpha_{Si_3N_4}=3.6\times10^{-6}$ C.$^{-1}$). By modeling the gold coated $Si_3N_4$ cantilevers as a bimorph system, the annealing induced curvature, expressed as the radius of an arc R, can be calculated from equation 2, $$R = \frac{3(D_1 + D_2)^2 D_1 D_2 E_1 E_2 + (D_1 E_1 + D_2 E_2)(D_1^3 E_1 + D_2^3 E_2)}{6 \Delta \alpha \Delta T (D_1 + D_2) D_1 D_2 E_1 E_2} \quad (2)$$

where D is the thickness ($D_1=D_{Au}=25$ nm; $D_2=D_{Si_3N_4}=400$ nm), E is Young's modulus ($E_1=E_{Au}=0.8\times10^{11}$ N m$^{-2}$; $E_2=E_{Si_3N_4}=3.8\times10^{11}$ N m$^{-2}$, $\Delta\alpha$ is the difference in the coefficients of thermal expansion, and $\Delta T$ is the change in temperature. The deflection or distance moved by the free end of the cantilever d can be represented by $d=L^2/2R$, where L is the length of the cantilevers.

Heating the tips to 300° C. would produce the expected deflection or curling of 14 microns. However, the experimentally determined value is about 20-30 microns, which is most likely a result of deviations in the thickness of Au and the $Si_3N_4$ layers across the entire tip arrays. (Wenzler et al., *Review of Scientific Instruments*, 67, 4191-4197 (1996).

Ink Coating: The pen arrays were placed inside a sealed metal container with ODT (the pen arrays were attached to the cover of the container with a piece of double-sticky tape). The container was heated to 70° C. and held for 30 minutes, and then allowed to slowly cool. This vapor coating process was repeated (typically 2-3 times) until the tips were sufficiently coated with ODT for DPN printing experiments. Importantly, the coated pen array could be used to pattern more than 25 samples over a period of three days without the need of recoating the tips with more ODT ink.

Figure 4:
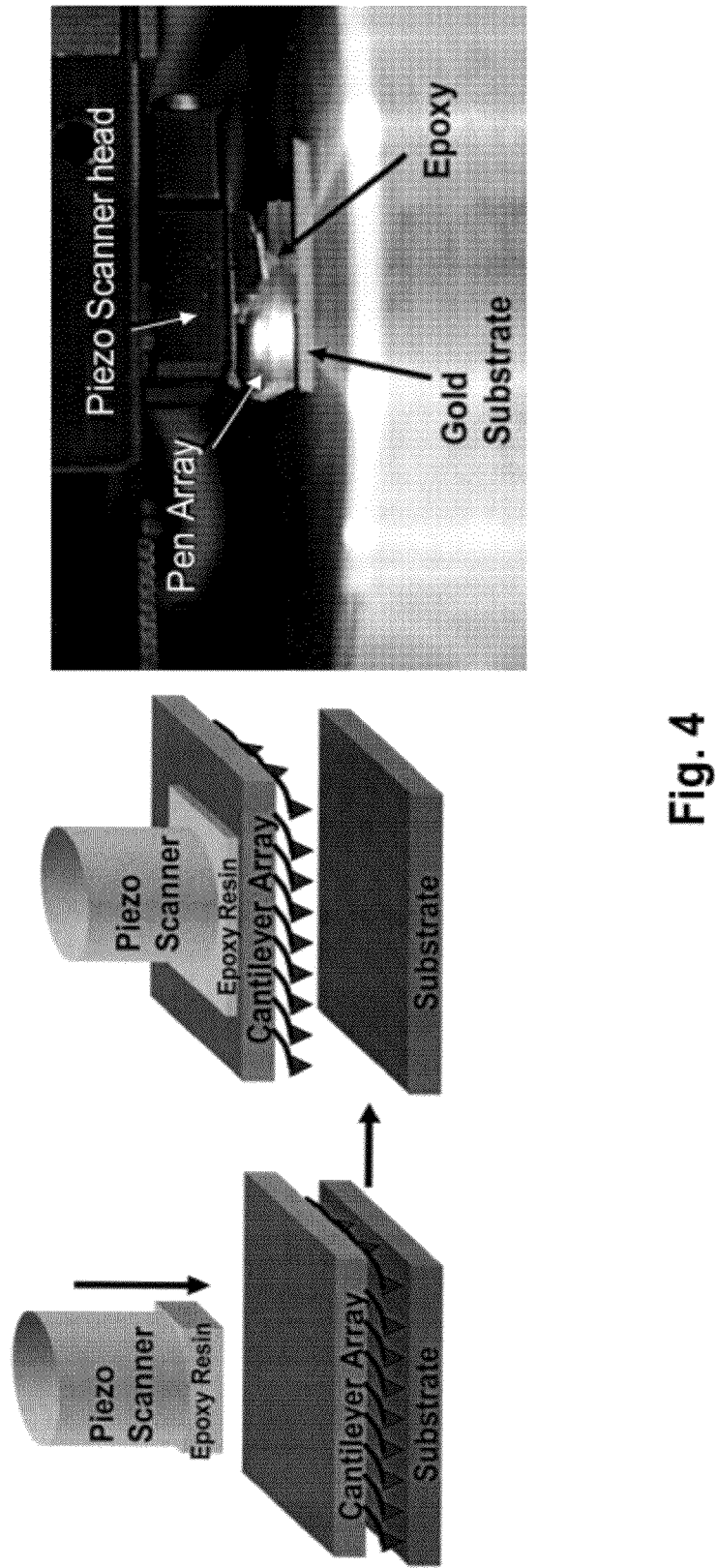
FIG. 4. (Left) Schematic diagram describing the procedure for mounting the pen array. (Right) Photograph depicting the mounted pen array being locked into the exact position as the epoxy hardens.
Figure 5:
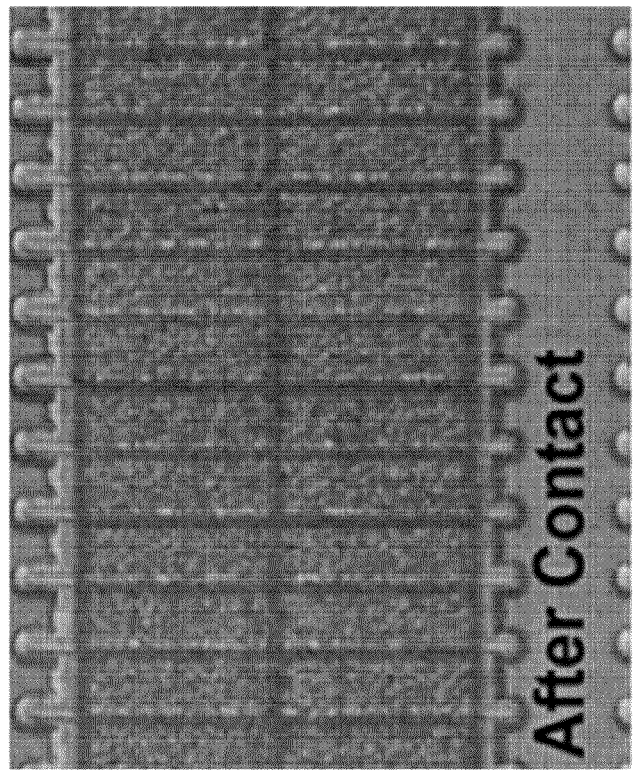
FIG. 5. Optical image of a 2D pen array before and after making contact with substrate.
Figure 5:
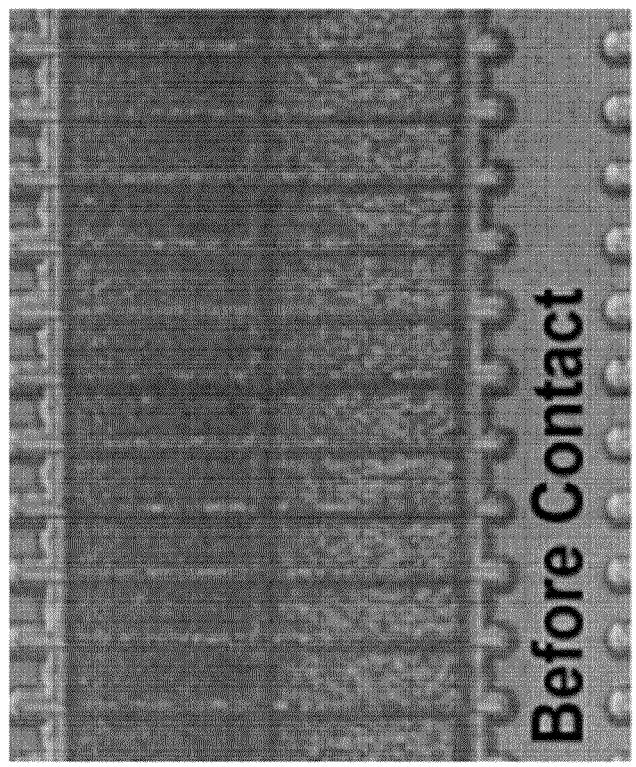

Pen Array Mounting: The pen array was gently placed onto a sacrificial Au-coated SiOx substrate, letting the weight of the tip array (about 100 mg, 20 nN/tip) bring all tips into contact with substrate. An epoxy coated magnetic tip holder (1 cm×0.2 cm) was then gently brought down in contact with the Pyrex support of the pen array using the z motors of the AFM (FIG. 4, right). Enough pressure was applied using the motors (about 20-50 micron lower than the epoxy-tip array contact point) until the epoxy starts spreading to fill the void between the tip holder and the tip array (FIG. 4). The epoxy was then left to fully harden over a period of at least 1 hr. Note that it was important in this example to use a thin film of epoxy, avoiding excess, since epoxy can undergo a 1-10% volume shrinkage during polymerization. (Schoch et al., *Thermochimica Acta*, 417, 115-118 (2004); Ramos et al, *Polymer*, 46, 3323-3328 (2005). After the epoxy was fully cured, all the tips could then be engaged with the substrate by moving the z-motors to the same (±0.2 microns) curing position. Interestingly, tip-substrate contact can be observed by monitoring the bending-induced change in the optical reflectivity of the cantilevers (FIG. 5). Note that the Au-coating enhances tip reflectivity. The exact position of the tip-substrate contact is maintained to within ±1 micron, and over 20 substrates were patterned by coming back to the same z position. Remarkably, the pen arrays could be remounted on the scanner head and used for high resolution patterning. This system provided for successfully patterning over cm square areas after remounting the tip array on the scanner head. Remounting the magnetic tip holder was facilitated by allowing a small amount of epoxy to mold onto one edge of the scanner head.

Dip Pen Nanolithography: DPN experiments were performed with an Nscriptor™ (NanoInk, Inc., Chicago, Ill.) equipped with a 100-micron scanner and closed-loop scan control and commercial lithographic software (DPNWrite™, DPN System-1, NanoInk, Inc., Chicago, Ill.). All DPN patterning experiments were carried out under ambient laboratory conditions without the aid of a clean room (about 30% relative humidity, about 20° C.).

Selective Etching of Au: Etching was performed on DPN-patterned gold substrates by immersing in a bath of 13.3 mM $Fe(NO_3)_3 9H_2O$, 20 mM thiourea, 0.3% HCl in octanol saturated nanopure water (15 mL of etch solution for a about 1 square cm substrate). (Xia et al., *Chemistry of Materials*, 7, 2332-2337 (1995); Geissler et al, *Langmuir*, 18, 2374-2377 (2002); Zhang et al., *Nano Letters*, 3, 43-45 (2003). The bath was gently stirred as the substrate was visually inspected for etching (rate about 6 nm/min). The color of the substrate changed from yellow to dark blue as the gold was dissolved.

Pattern Characterization. Patterned structures, post etching, were characterized by SEM (Leo Gemini 1525), and optical microscopy (Zeiss Axiovert 100A inverted microscope, Thornwood N.Y.) equipped with a Penguin 600CL digital camera and StreamPix software. These tools provide a relatively high throughput method for evaluating the quality of the patterned structures. Tapping mode AFM images were collected with a Nanoman AFM equipped with a Nanoscope IV controller from Veeco (Santa Barbara, Calif.) with silicon tips (NCH—W, Veeco, spring constant 40 N/m) scanned at a rate of 0.5 Hz and set to a pixel resolution of 512×512. Gold coated commercial AFM cantilevers (sharpened $Si_3N_4$, Type A, NanoInk, Inc.) with a spring constant of 0.05 N/m were used for contact mode imaging.

Figure 6:
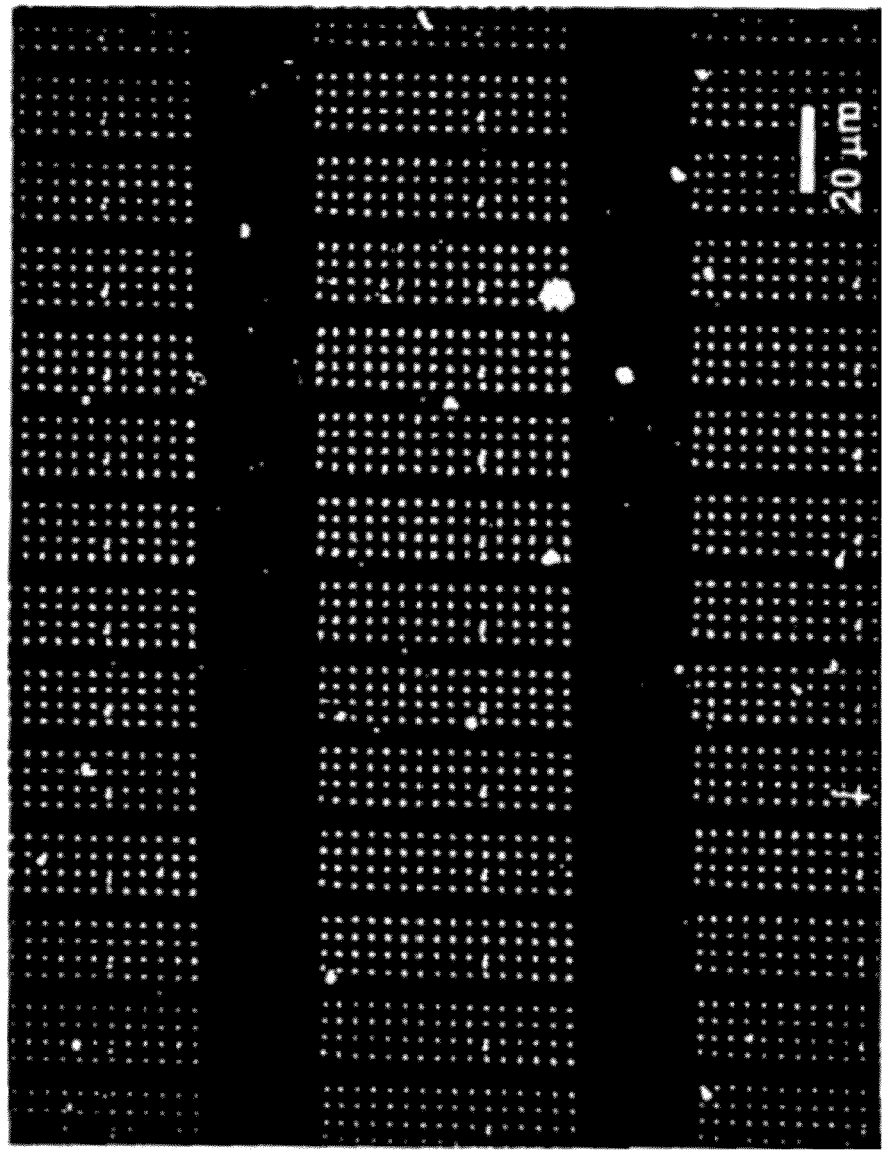
FIG. 6. Dark Field optical micrograph of Au dots in 4×16 arrays demonstrating the wide writing range of the 2D pen array.
Figure 7:
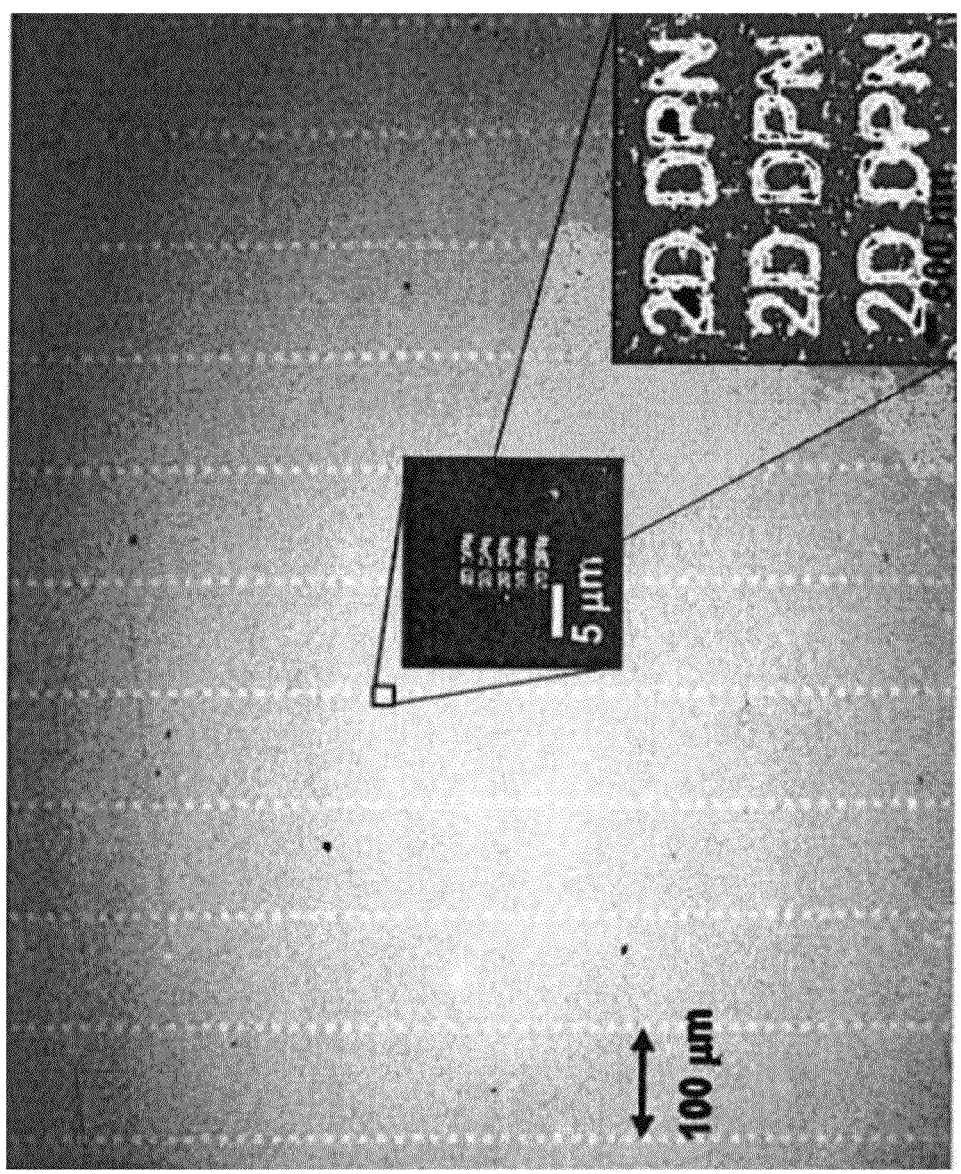
FIG. 7. Optical micrograph of Au structures drawn in shape of the characters "2D DPN" on a silicon substrate. Inset (center) shows dark field micrograph of one of the structures produced by one tip. Inset (right corner) is an SEM of these structures.
Figure 8:
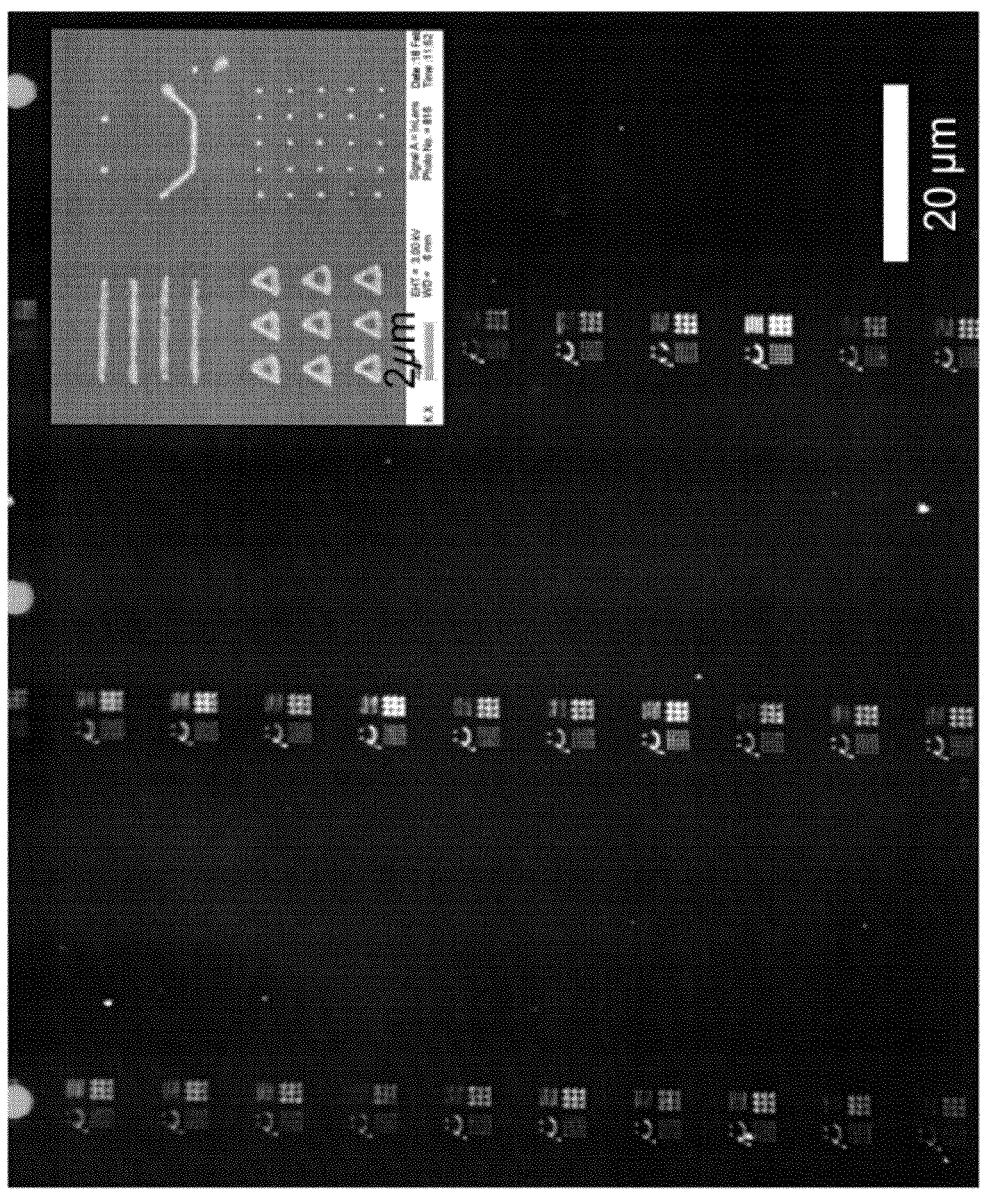
FIG. 8. Dark Field micrograph of a combinatorial Au structures. Each pen produced a set of structures divided into four quadrants comprising nine triangles, four lines, 25 dots, and a "smiley face." (inset) SEM shows one of these structures at high magnification.

Additional Examples of 2D Parallel DPN: Shown below are three additional examples that demonstrate the rapid prototyping capability of 2D parallel DPN reported herein. FIG. 6 shows Au dot arrays spanning nearly the entire writing range of each cantilever. FIG. 7 shows Au structures developed from molecular ODT patterns in the form of the characters "2D DPN." Each pen generated five structures occupying an area of 9×7 microns with a total patterning time of 9 min. FIG. 8 shows Au structures in the shape of nine triangle, four lines, 5×5 dots, and a "smiley face" occupying four quadrants of the patterning area of each pen. The total patterning time in this case was about five minutes. Note that these structures are just two examples and virtually any pattern geometry can be generated.

Figure 9:
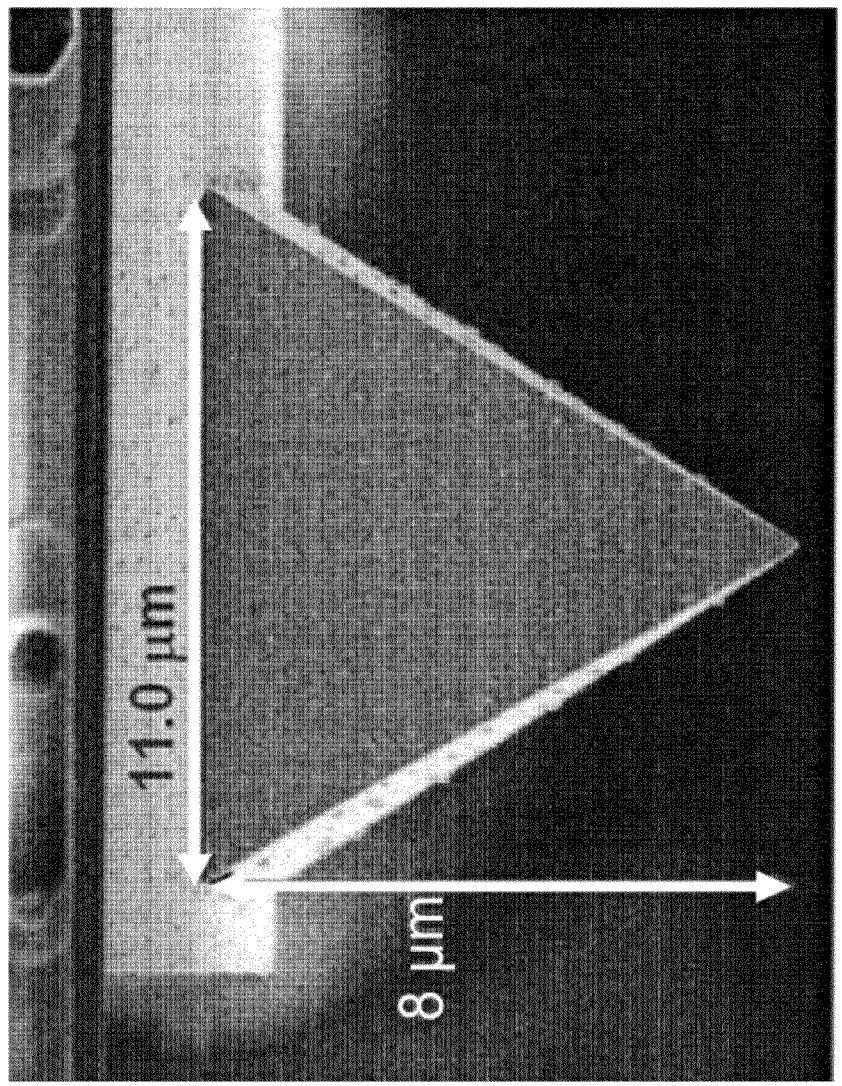
FIG. 9. SEM image of pyramidal tip, where the measured tip apex height is 8.8 microns and the base is 11.0 microns.

Apex height was measured for a pyramidal tip as shown in FIG. 9.

Figure 10:
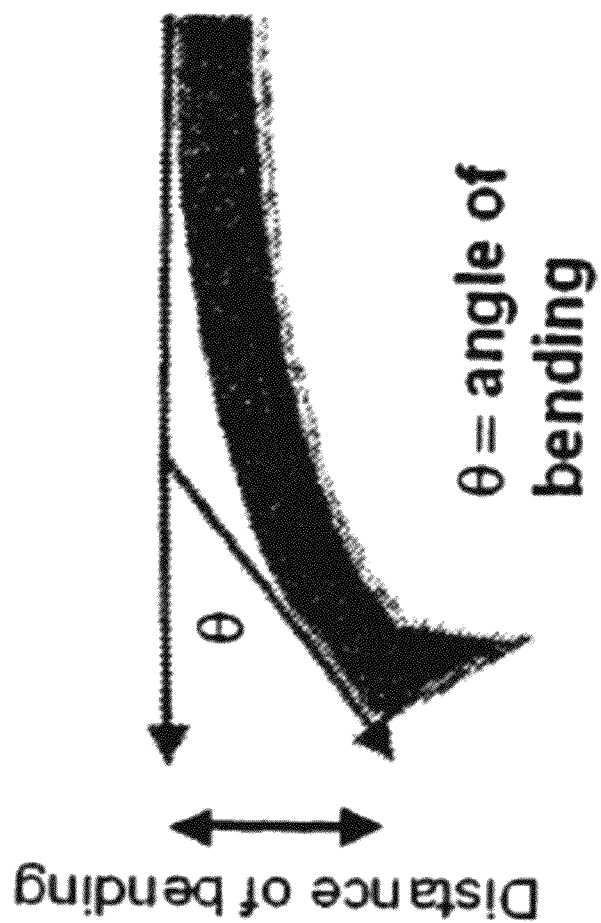
FIG. 10. Illustrating measurement of angle of cantilever bending and distance of cantilever bending.

FIG. 10 shows how distance of bending and angle of bending was measured when the cantilevers are bent at an angle from their base and the cantilevers are bent at an average distance.

All references cited herein are hereby incorporated by reference in their entirety.

What is claimed is:

1. An article comprising:
   a support;
   a plurality of base rows disposed on the support; and
   a plurality of cantilevers extending from each of the base rows and forming a two-dimensional array of cantilevers, each of the cantilevers comprising a tip at an end of the cantilever away from a corresponding base row,
   wherein each of the cantilevers is attached to the support at a first surface of the cantilevers, and each of the tips is disposed on a second, opposing surface of the cantilevers,
   wherein each of the cantilevers comprises a bent portion such that the cantilevers are bent at an angle away from the support,
   wherein each of the cantilevers comprises a first layer and a second layer, the first layer having a different thermal expansion coefficient than the second layer so as to cause the bent portion in the cantilevers,
   wherein the tips have an apex height relative to the cantilever of at least seven microns, and
   wherein the cantilevers and tips are configured for use in direct-write nanolithography.

2. An article according to claim 1, wherein the cantilevers are bent at an angle of at least 10° away from the support.

3. An article according to claim 1, wherein the array is characterized by a tip spacing of less than 300 microns in a first dimension of the two dimensional array and less than 300 microns in a second dimension of the two dimensional array.

4. An article according to claim 1, wherein the array is characterized by a tip spacing of less than 200 microns in a first dimension of the two dimensional array and less than 50 microns in a second dimension of the two dimensional array.

5. An article according to claim 1, wherein the array is characterized by a tip spacing of 100 microns or less in at least one dimension of the two dimensional array.

6. An article according to claim 1, wherein the number of cantilevers is greater than 250.

7. An article according to claim 1, wherein the number of cantilevers is greater than 10,000.

8. An article according to claim 1, wherein the number of cantilevers is greater than 55,000.

9. An article according to claim 1, wherein each of the tips are characterized by a distance D spanning the tip end to the support, and the tip array is characterized by an average distance D' of the tip end to the support, and for at least 90% of the tips, D is within 50 microns of D'.

10. An article according to claim 1, wherein each of the tips are characterized by a distance D spanning the tip end to the support, and the tip array is characterized by an average distance D' of the tip end to the support, and for at least 90% of the tips, D is within 10 microns of D'.

11. An article according to claim 1, wherein the base rows have an average length of at least about 1 mm.

12. An article according to claim 1, wherein the cantilevers are bimorph cantilevers.

13. An article according to claim 1, wherein the cantilevers are not adapted for feedback.

14. An article according to claim 1, wherein at least one of the cantilevers is adapted for feedback.

15. An article according to claim 1, wherein substantially all of the cantilevers are adapted for feedback.

16. An article according to claim 1, wherein the base rows have a height with respect to the support of at least about 5 microns.

17. An article according to claim 1, wherein the tips have an average radius of curvature of less than 100 nm.

18. An article according to claim 1, wherein the tips have an average radius of curvature of about 10 nm to about 50 nm.

19. An article according to claim 1, wherein the cantilevers have an average force constant of about 0.001 N/m to about 10 N/m.

20. An article according to claim 1, wherein the cantilevers have an average force constant of about 0.05 N/m to about 1 N/m.

21. An article according to claim 1, wherein the array support is characterized by a surface on the far side away from the cantilever tips comprising a surface area which is about two square cm or less.

22. An article according to claim 1, wherein the array is characterized by a cantilever yield of at least 95%.

23. An article according to claim 1, wherein the array is characterized by a cantilever yield of at least 98%.

24. An article according to claim 1, wherein the cantilevers are bound to the base by a non-adhesive bonding.

25. An article according to claim 1, wherein the tips are coated with a patterning compound.

26. An article according to claim 1, wherein the cantilevers are bent on average about 10 microns to about 50 microns.

27. An article according to claim 1, wherein the cantilevers are bent at an angle of at least 10° away from the support, and wherein the array is characterized by a tip spacing of less than 300 microns in a first dimension of the two dimensional array and less than 300 microns in a second dimension of the two dimensional array.

28. An article according to claim 27, wherein the number of cantilevers is greater than 250.

29. An article according to claim 27, wherein the cantilevers comprise multiple layers adapted for bending the cantilever.

30. An article according to claim 27, wherein the cantilevers are bound to the base by a non-adhesive bonding.

31. An article according to claim 1, wherein the cantilevers are bent at an angle of at least 10° away from the support, and wherein the array is characterized by a tip spacing of less than 200 microns in a first dimension of the two dimensional array and less than 50 microns in a second dimension of the two dimensional array.

32. An article according to claim 31, wherein the number of cantilevers is greater than 10,000.

\* \* \* \* \*